United States Patent
Tani et al.

(10) Patent No.: US 10,256,048 B2
(45) Date of Patent: Apr. 9, 2019

(54) PHOTOELECTRIC CONVERSION ELEMENT AND DYE-SENSITIZED SOLAR CELL

(71) Applicants: FUJIFILM Corporation, Tokyo (JP); Sharp Kabushiki Kaisha, Sakai, Osaka (JP)

(72) Inventors: Yukio Tani, Kanagawa (JP); Katsumi Kobayashi, Kanagawa (JP); Ryohsuke Yamanaka, Sakai (JP); Atsushi Fukui, Sakai (JP); Norio Murofushi, Sakai (JP)

(73) Assignees: FUJIFILM Corporation, Tokyo (JP); SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/817,413

(22) Filed: Nov. 20, 2017

(65) Prior Publication Data

US 2018/0090280 A1    Mar. 29, 2018

Related U.S. Application Data

(63) Continuation of application No. PCT/JP2016/064740, filed on May 18, 2016.

(30) Foreign Application Priority Data

May 25, 2015    (JP) .................. 2015-105248

(51) Int. Cl.
  *H01G 9/20*    (2006.01)
  *C09B 57/10*    (2006.01)
  *H01L 51/00*    (2006.01)

(52) U.S. Cl.
  CPC .......... *H01G 9/2004* (2013.01); *C09B 57/10* (2013.01); *H01G 9/2059* (2013.01);
  (Continued)

(58) Field of Classification Search
  CPC ...................................... C09B 57/10
  See application file for complete search history.

(56) References Cited

U.S. PATENT DOCUMENTS 5,463,057 A    10/1995  Graetzel et al.
9,953,768 B2 *  4/2018  Tani .............. C09B 23/005
    (Continued)

FOREIGN PATENT DOCUMENTS

EP        2980816 A1    2/2016
JP     2011-44357 A    3/2011
    (Continued)

OTHER PUBLICATIONS

Sheng-Wei Wang et al., Panchromatic RU(II) sensitizers bearing single thiocyanate for high efficiency dye senisitzed solar cells, Journal of Materials Chemistry A, vol./Issue 2, pp. 17618-17627 (Year: 2014).*

(Continued)

*Primary Examiner* — Jayne L Mershon
(74) *Attorney, Agent, or Firm* — Sughrue Mion, PLLC

(57) ABSTRACT

Provided are a photoelectric conversion element and a dye sensitized solar cell having a supporting substrate, a conductive layer, a power generating layer having a porous semiconductor layer onto which a metal complex dye represented by Formula (1) is adsorbed, a porous insulating layer, and a counter electrode conductive layer, in which the layers are laminated in this order on the supporting substrate, and voids that each of the power generating layer, the porous insulating layer, and the counter electrode conductive layer has are filled with an electrolyte.

(Continued)

US 10,256,048 B2
Page 2

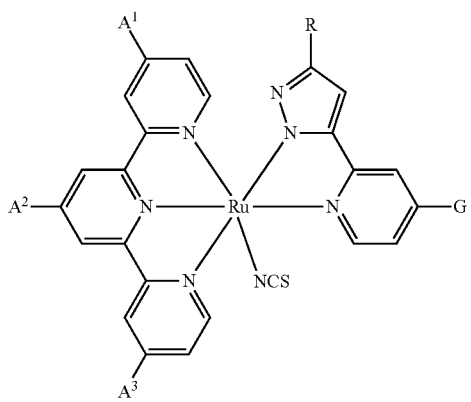

Formula (1)

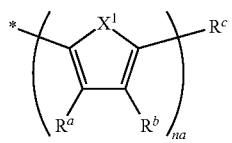

Formula (G-1)

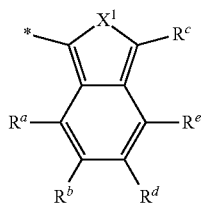

Formula (G-2)

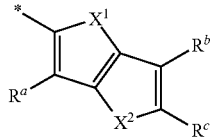

Formula (G-3)

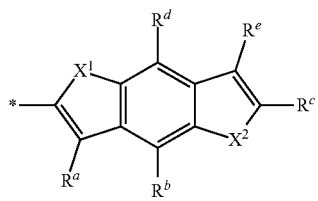

Formula (G-4)

R represents a hydrogen atom, an alkyl group, or an aryl group. G represents a group represented by any one of Formulae (G-1) to (G-4). $A^1$ to $A^3$ each represent a hydrogen atom, a carboxyl group, or a salt thereof. At least one of $A^1$ to $A^3$ is a carboxyl group or a salt thereof. $X^1$ and $X^2$ each represent —O—, —S—, and others. $R^a$ represents an alkyl group and the like. $R^b$ to $R^e$ each represent a hydrogen atom or a substituent. na represents 1 to 3. (G-1) to (G-4) are bonded to a pyridine ring in the portion of *.

3 Claims, 1 Drawing Sheet

(52) U.S. Cl.
CPC ....... *H01G 9/2068* (2013.01); *H01L 51/0086* (2013.01); *H01G 9/2031* (2013.01); *Y02E 10/542* (2013.01); *Y02E 10/549* (2013.01)

(56) References Cited

U.S. PATENT DOCUMENTS

| | | |
|---|---|---|
| 2010/0258175 A1 | 10/2010 | Chi et al. |
| 2012/0132280 A1 | 5/2012 | Nagano et al. |
| 2014/0007923 A1* | 1/2014 | Lanuti .................. H01G 9/2081 136/251 |
| 2016/0012977 A1 | 1/2016 | Tani et al. |

FOREIGN PATENT DOCUMENTS

| | | |
|---|---|---|
| JP | 2013-161751 A | 8/2013 |
| JP | 2014-209588 A | 11/2014 |
| JP | 2014-209589 A | 11/2014 |
| JP | 2014-209606 A | 11/2014 |
| JP | 2016-174107 A | 9/2016 |
| WO | 2014/157005 A1 | 10/2014 |

OTHER PUBLICATIONS

International Search Report dated Aug. 9, 2016, issued by the International Searching Authority in application No. PCT/JP2016/064740 [PCT/ISA/210].
International Preliminary on Patentability Report dated Mar. 1, 2017, issued by the International Searching Authority in application No. PCT/JP2016/064740 [PCT/IPEA/409].
Written Opinion dated Aug. 9, 2016, issued by the International Searching Authority in application No. PCT/JP2016/064740 [PCT/ISA/237].
Communication dated May 16, 2018 from the European Patent Office in counterpart European application No. 16799898.8.
Wang, S.-W., et al., "Panchromatic Ru (II) sensitizers bearing single thiocyanate for high efficiency dye sensitized solar cellst", Journal of Materials Chemistry A: Materials for Energy and Sustainability, 2014, vol. 2, No. 41, pp. 17618-17627 (10 pages), XP55427769.

* cited by examiner

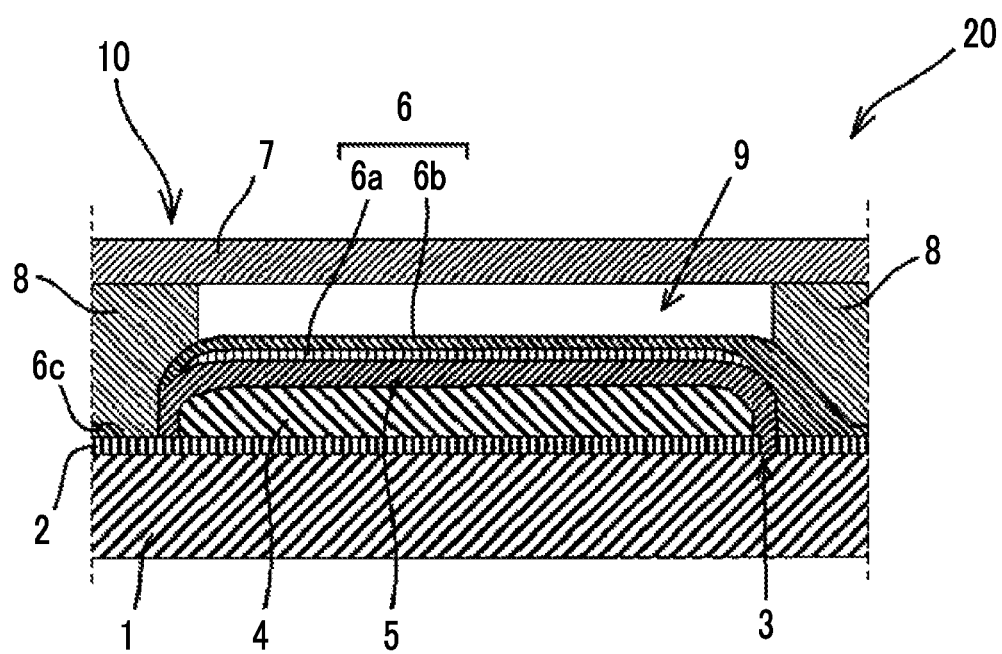

PHOTOELECTRIC CONVERSION ELEMENT AND DYE-SENSITIZED SOLAR CELL

CROSS-REFERENCE TO RELATED APPLICATIONS

This application is a Continuation of PCT International Application No. PCT/JP2016/064740 filed on May 18, 2016, which claims priority under 35 U.S.C. § 119 (a) to Japanese Patent Application No. JP2015-105248 filed in Japan on May 25, 2015. Each of the above applications is hereby expressly incorporated by reference, in its entirety, into the present application.

BACKGROUND OF THE INVENTION

1. Field of the Invention

The present invention relates to a photoelectric conversion element and a dye sensitized solar cell.

2. Description of the Related Art

Photoelectric conversion elements are used in various photosensors, copy machines, solar cells, and the like. The photoelectric conversion elements have been put to practical use in the form of photoelectric conversion elements adopting various modes, such as photoelectric conversion elements using metals, photoelectric conversion elements using semiconductors, photoelectric conversion elements using organic pigments or dyes, or photoelectric conversion elements as a combination of these. Because solar cells using inexhaustible solar energy do not require fuel and use inexhaustible clean energy, full-scale commercialization of solar cells is highly anticipated. Among solar cells, silicon-based solar cells have been researched and developed for a long period of time, and are becoming increasingly popular by the political support of each country. However, in order to greatly reduce the cost of power generation down to a level corresponding to the current grid parity, a big breakthrough needs to be achieved.

Dye sensitized solar cells which are photoelectric conversion elements are solar cells that can be manufactured mainly by coating or a printing process. Because a huge cost down is anticipated, the dye sensitized solar cells are actively researched.

U.S. Pat. No. 5,463,057A describes a sensitized photoelectric conversion element using semiconductor fine particles sensitized by a ruthenium metal complex dye by applying the aforementioned technique. Since then, in order to improve the photoelectric conversion efficiency, ruthenium metal complex dyes have been continuously developed (see US2010/0258175A).

SUMMARY OF THE INVENTION

A lot of research and development using N749 as a ruthenium metal complex dye having a terpyridyl-based ligand are being conducted, and the ruthenium metal complex dye described in US2010/0258175A is obtained by improving N749. However, even though these ruthenium metal complex dyes are used, in a case where an element structure is adopted in which a porous insulating layer is used between a power generating layer and a counter electrode conductive layer, a short-circuit current density as high as being anticipated cannot be obtained, the photoelectric conversion efficiency of a photoelectric conversion element is low, and the photoelectric conversion efficiency at a high temperature (for example, 85° C.) is reduced (durability is low).

The present invention has been made in consideration of the current circumstances, and an object thereof is to provide a photoelectric conversion element and a dye sensitized solar cell which make it possible to improve the photoelectric conversion efficiency and achieve high durability even though the element and the solar cell have a structure in which a porous insulating layer is used between a power generating layer and a counter electrode conductive layer.

The aforementioned object was achieved by means described below.

<1> A photoelectric conversion element comprising a supporting substrate, a conductive layer, a power generating layer having a porous semiconductor layer onto which a metal complex dye is adsorbed, a porous insulating layer, and a counter electrode conductive layer, in which the layers are laminated in this order on the supporting substrate, voids that each of the power generating layer, the porous insulating layer, and the counter electrode conductive layer has are filled with an electrolyte, and the metal complex dye is represented by Formula (1).

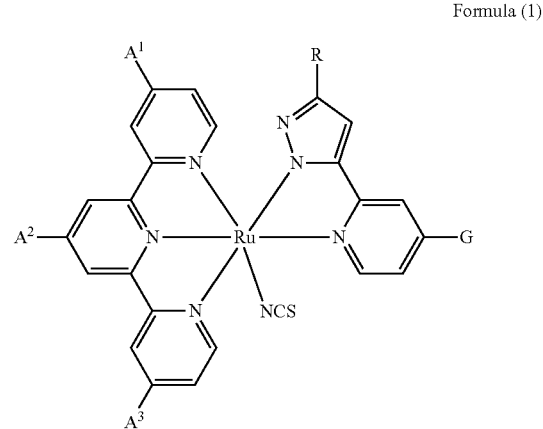

Formula (1)

In Formula (1), R represents a hydrogen atom, an alkyl group, or an aryl group. G represents a group represented by any one of Formulae (G-1) to (G-4). $A^1$, $A^2$, and $A^3$ each independently represent a hydrogen atom, a carboxyl group, or a salt of a carboxyl group. Here, at least one of $A^1$, $A^2$, or $A^3$ is a carboxyl group or a salt of a carboxyl group.

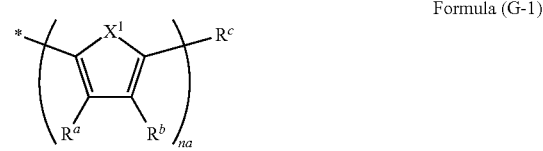

Formula (G-1)

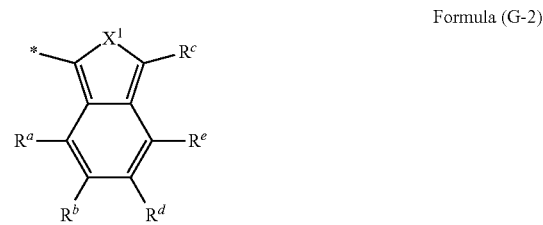

Formula (G-2)

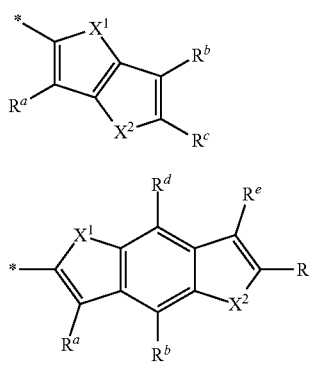

Formula (G-3)

Formula (G-4)

In Formulae (G-1) to (G-4), $X^1$ and $X^2$ each independently represent —O—, —S—, —Se—, —N($R^A$)—, —C($R^A$)$_2$—, or —Si($R^A$)$_2$—. $R^A$ represents a hydrogen atom, an alkyl group, or an aryl group. na represents an integer of 1 to 3. $R^a$ represents an alkyl group, an alkoxy group, an alkylthio group, or an amino group. $R^b$, $R^c$, $R^d$, and $R^e$ each independently represent a hydrogen atom or a substituent. (G-1) to (G-4) are bonded to a pyridine ring in the portion of *.

<2> The photoelectric conversion element described in <1>, in which G is represented by Formula (G-1).

<3> The photoelectric conversion element described in <1> or <2>, in which the metal complex dye is represented by Formula (2).

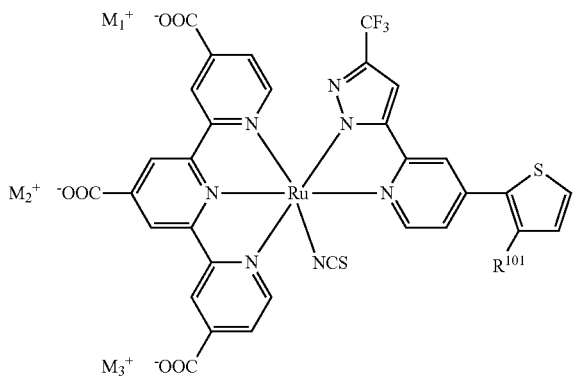

Formula (2)

In Formula (2), $M_1^+$, $M_2^+$, and $M_3^+$ each independently represent a proton or a counterion. $R^{101}$ represents an alkyl group.

<4> The photoelectric conversion element described in <3>, in which $R^{101}$ represents an alkyl group having 2 to 12 carbon atoms.

<5> A dye sensitized solar cell comprising a plurality of photoelectric conversion elements described in any one of <1> to <4> that are connected to each other.

In the present specification, unless otherwise specified, regarding a carbon-carbon double bond, in a case where an E-isomer and a Z-isomer are present in a molecule, the molecule may be either the E-isomer or the Z-isomer or may be a mixture of these. Furthermore, in a case where there are a plurality of substituents, linking groups, ligands, and the like (hereinafter, referred to as substituents and the like) marked with a specific reference, or in a case where the plurality of substituents and the like are specified collectively, unless otherwise specified, the substituents and the like may be the same as or different from each other. The same will be applied to a case where the number of substituents and the like is specified. In addition, in a case where the plurality of substituents and the like are close to each other (particularly, in a case where the substituents and the like are adjacent to each other), unless otherwise specified, the substituents and the like may form a ring by being linked to each other. Moreover, rings, for example, an alicyclic ring, an aromatic ring, or a heterocyclic ring may form a fused ring by being further fused.

The present invention can provide a photoelectric conversion element and a dye sensitized solar cell which improve the photoelectric conversion efficiency and exhibit high durability even though an element structure is adopted in which a porous insulating layer is used between a power generating layer and a counter electrode conductive layer.

The aforementioned characteristics as well as other characteristics and advantages of the present invention will be further clarified by the following description with reference to the attached drawing as appropriate.

BRIEF DESCRIPTION OF THE DRAWINGS

FIG. 1 is a cross-sectional view schematically showing an enlarged photoelectric conversion element of the present invention in a preferred aspect of a dye sensitized solar cell of the present invention.

DESCRIPTION OF THE PREFERRED EMBODIMENTS

Hereinafter, an embodiment of the present invention will be specifically described. The embodiment is merely an example, and the present invention can be embodied in various aspects within the scope of the present invention.

<<Photoelectric Conversion Element>>

As a preferred aspect of the photoelectric conversion element of the present invention, a photoelectric conversion element 10 shown in FIG. 1 and the like can be exemplified. The photoelectric conversion element 10 has a supporting substrate 1, a conductive layer 2, a power generating layer 4 having a porous semiconductor layer onto which a metal complex dye (hereinafter, simply referred to as a dye in some cases) represented by Formula (1) is adsorbed, a porous insulating layer 5, a counter electrode conductive layer 6, in which the above layers are laminated in this order on the supporting substrate 1. Voids that each of the power generating layer 4, the porous insulating layer 5, and the counter electrode conductive layer 6 has contain an electrolyte.

<Supporting Substrate>

Within the supporting substrate 1 in FIG. 1, a portion that will become a light receiving surface of the photoelectric conversion element 10 needs to have light-transmitting properties. Therefore, the supporting substrate 1 is preferably formed of at least a light-transmitting material and has a thickness of about 0.2 to 5 mm.

The material constituting the supporting substrate 1 is not particularly limited as long as the material can be generally used in the photoelectric conversion element 10 and can exhibit the effects of the present invention. Examples of such a material include a glass substrate such as soda-lime glass, molten quartz glass, crystalline quartz glass, and borosilicate glass, heat-resistant resin substrate such as a flexible film, and the like.

Examples of materials constituting the flexible film (hereinafter, referred to as "film" as well) include tetraacetyl cellulose (TAC), polyethylene terephthalate (PET), polyphenylene sulfide (PPS), polycarbonate (PC), polyarylate (PA), polyetherimide (PEI), a phenoxy resin, Teflon (registered trademark), and the like.

In a case where other layers are formed on the supporting substrate 1 by performing heating, for example, in a case where a conductive layer 2 is formed on the supporting substrate 1 by performing heating at a temperature of about 250° C., among the aforementioned film materials, Teflon (registered trademark) that resists heat up to a temperature of equal to or higher than 250° C. is particularly preferable.

In a case where the completed photoelectric conversion element 10 is mounted on other structures, the supporting substrate 1 can be used. That is, by using a metal-processed part and a screw, the peripheral portion of the supporting substrate such as a glass substrate can be easily mounted on other supporting substrates.

<Conductive Layer>

In the photoelectric conversion element 10, the conductive layer 2 (in the present invention, the conductive layer 2 will be referred to as a first conductive layer 2 in some cases so as to be differentiated from the counter electrode conductive layer 6 which will be described later) becomes a light receiving surface of the photoelectric conversion element 10 and is formed of a light-transmitting material because the conductive layer 2 needs to have light-transmitting properties. Here, the conductive layer 2 may be formed of a material substantially transmitting the light of a wavelength that exhibits effective sensitivity with respect to a metal complex dye represented by Formula (1) which will be described later, and does not need to exhibit transmitting properties with respect to light of all the wavelength ranges.

The light-transmitting material is not particularly limited as long as the material can be generally used in photoelectric conversion elements and can exhibit the effects of the present invention. Examples of such a material include indium-tin composite oxide (ITO), fluorine-doped tin oxide (FTO), zinc oxide (ZnO), and the like.

The film thickness of the conductive layer 2 is preferably about 0.02 to 5 μm. The lower the film resistance of the conductive layer 2, the better. The film resistance of the conductive layer 2 is preferably equal to or lower than 40 Ω/sq.

The conductive layer 2 may be provided with a metal lead wire such that the resistance thereof is reduced. Examples of materials of the metal lead wire include platinum, gold, silver, copper, aluminum, nickel, titanium, and the like.

In a case where the provision of the metal lead wire results in the reduction in the amount of incidence rays from the light receiving surface, it is preferable to render the thickness of the metal lead wire become about 0.1 to 4 mm.

The conductive layer 2 includes a scribe line 3 formed by cutting by means of laser scribing.

<Power Generating Layer>

The power generating layer 4 is obtained by causing the metal complex dye represented by Formula (1) to be adsorbed onto the porous semiconductor layer and filling voids (micropores) of the porous semiconductor layer with an electrolyte.

—Porous Semiconductor Layer—

The porous semiconductor layer is constituted with a semiconductor, and it is possible to use porous semiconductor layers of various shapes such as a particle shape and a film shape having many micropores. The porous semiconductor layer preferably has a film shape having many micropores.

The semiconductor material constituting the porous semiconductor layer is not particularly limited as long as the material is generally used in photoelectric conversion elements. Examples of such a material include compounds, such as titanium oxide, zinc oxide, tin oxide, iron oxide, niobium oxide, cerium oxide, tungsten oxide, nickel oxide, strontium titanate, cadmium sulfide, lead sulfide, zinc sulfide, indium phosphide, copper-indium sulfide ($CuInS_2$), $CuAlO_2$, and $SrCu_2O_2$, and a combination of these. Among these, titanium oxide, zinc oxide, tin oxide, and niobium oxide are preferable, and from the viewpoint of photoelectric conversion efficiency and stability, titanium oxide is particularly preferable. Furthermore, these semiconductor materials can be used as a mixture of two or more kinds thereof.

Herein, titanium oxide includes various titanium oxides of a narrow sense such as anatase-type titanium oxide, rutile-type titanium oxide, amorphous titanium oxide, metatitanic acid, and orthotitanic acid, titanium hydroxide, hydrous titanium oxide, and the like. These can be used singly or as a mixture. The crystal system of two kinds of titanium oxides of the anatase type and the rutile type can become any form according to the preparation process or the heat history thereof, but is generally the anatase type.

From the viewpoint of stability, ease of crystal growth, manufacturing costs, and the like, the above semiconductor material constituting the porous semiconductor layer is preferably a polycrystalline sintered material formed of fine particles.

From the viewpoint of obtaining a sufficiently large effective surface area with respect to a projected area such that the incidence rays are converted into electric energy at a high yield, the average particle size of the aforementioned fine particles is equal to or greater than 5 nm and less than 50 nm, and preferably equal to or greater than 10 nm and equal to or smaller than 30 nm.

The light-scattering properties of the porous semiconductor layer can be adjusted by the average particle size of the semiconductor material used for forming the layer. Specifically, a porous semiconductor layer formed of semiconductor particles having a large average particle size excellently scatters light and can improve a light collecting rate by scattering the incidence rays, although these properties also depend on the formation condition of the porous semiconductor layer. Furthermore, a porous semiconductor layer formed of semiconductor particles having a small average particle size poorly scatters light and can increase an adsorption amount by further increasing the number of adsorption spots of a dye.

In addition, a layer formed of semiconductor particles having an average particle size which is equal to or greater than 50 nm and preferably equal to or greater than 50 nm and equal to or smaller than 600 nm may be provided on the polycrystalline sintered material formed of the aforementioned fine particles.

The average particle size of the semiconductor material is not particularly limited as long as the average particle size is within the aforementioned range in which the effects of the present invention can be exhibited. In view of effectively using the incidence rays for photoelectric conversion, it is preferable that the average particle size is controlled to some extent similarly to a commercially available semiconductor material powder.

The film thickness of the porous semiconductor layer is not particularly limited, but is preferably about 0.5 to 50 μm from the viewpoint of photoelectric conversion efficiency. Particularly, in a case where a layer is provided which excellently scatters light and is formed of semiconductor particles having an average particle size of equal to or greater than 50 nm, the film thickness of the layer is 0.1 to 40 μm and preferably 5 to 20 μm. The film thickness of a layer formed of particles having an average particle size of equal to or greater than 5 nm and less than 50 nm is 0.1 to 50 μm and preferably 10 to 40 μm.

In order to improve the photoelectric conversion efficiency of the photoelectric conversion element, it is preferable to form the power generating layer 4 by causing more dye to be adsorbed onto the porous semiconductor layer. Accordingly, it is preferable that the film-like porous semiconductor layer has a large specific surface area which is preferably about 10 to 200 m$^2$/g.

<Porous Insulating Layer>

Generally, the porous insulating layer 5 is provided between the power generating layer 4 and the counter electrode conductive layer 6. As an insulating material used in the porous insulating layer 5, glass or the materials having a high conduction band level such as zirconium oxide, silicon oxide, aluminum oxide, niobium oxide, and strontium titanate are used. Among these, zirconium oxide is preferable.

Depending on the porous insulating material, the adsorption of a dye onto the power generating layer 4 is hindered in some cases. In these cases, the film thickness of the porous insulating layer 5 is preferably 3 to 12 μm.

<Counter Electrode Conductive Layer>

In the photoelectric conversion element 10, the counter electrode conductive layer 6 is preferably constituted with a catalyst layer 6a and a second conductive layer 6b. In a case where the second conductive layer 6b has a catalytic ability, the catalyst layer 6a may not be provided. The voids in the counter electrode conductive layer 6 are filled with an electrolyte which will be described later.

The material constituting the second conductive layer 6b is not particularly limited as long as the material can be generally used in photoelectric conversion elements and exhibits corrosion resistance against an electrolyte. Examples of such a material include titanium, nickel, molybdenum, and the like. Among these, titanium is the most preferable.

In a case where the counter electrode conductive layer 6 is formed by a vapor deposition method or a sputtering method, because the film itself is porous, it is not necessary to additionally form holes through which a solution for dye adsorption or an electrolyte moves. Here, in a case where the second conductive layer 6b has a large film thickness, the pores tends to become small. Furthermore, in a case where the film thickness of the second conductive layer 6b is too small, the resistance increases, and in a case where the film thickness of the second conductive layer 6b is too large, the movement of the solution for dye adsorption or the electrolyte is hindered.

In a case where the movement of the solution for dye adsorption or the electrolyte is difficult, holes or grooves may be formed in the second conductive layer 6b by laser processing or pattern formation.

The holes in the second conductive layer 6b can be formed by causing the second conductive layer 6b to partially evaporate by being irradiated with laser beams. The holes are preferably formed at a diameter of 0.1 μm to 100 μm and an interval of 1 μm to 200 μm, and more preferably formed at a diameter of 1 μm and 100 μm and an interval of 5 μm to 200 μm.

The optimal film thickness of the second conductive layer 6b is preferably 400 nm to 100 μm. In a case where the optimal film thickness is less than 400 nm, the value of resistance is high, and hence the output is reduced. In a case where the optimal film thickness is larger than 100 μm, the film is peeled off in some cases.

If necessary, the first conductive layer 2 and the second conductive layer 6 are provided with an extraction electrode (not shown in FIG. 1). The material constituting the extraction electrode is not particularly limited as long as the material can be generally used in photoelectric conversion elements and can exhibit the effects of the present invention.

—Catalyst Layer—

It is preferable that the catalyst layer 6a is formed on any surface of the counter electrode conductive layer 6. The material constituting the catalyst layer 6a is not particularly limited as long as the material can be generally used in photoelectric conversion elements and can exhibit the effects of the present invention. As such a material, for example, platinum and carbon are preferable. The carbon is preferably in the form of carbon black, graphite, glass carbon, amorphous carbon, hard carbon, soft carbon, a carbon whisker, a carbon nanotube, fullerene, and the like.

The catalyst layer may be formed by a vapor deposition method, a sputtering method, or a coating method using a fine particle dispersion paste of a catalyst material.

<Electrolyte>

In the photoelectric conversion element 10, an electrolyte fills an electrolyte filling region 9 surrounded by the conductive layer 2 as well as a cover layer 7 and a sealing material 8 which will be described later, and fills the voids that each of the power generating layer 4, the porous insulating layer 5, and the counter electrode conductive layer 6 has. The electrolyte is constituted with a conductive material which can transport ions. Examples of suitable materials of the electrolyte include a liquid electrolyte, a solid electrolyte, a gel electrolyte, a molten salt gel electrolyte, and the like.

The liquid electrolyte may be a liquid material containing a redox species, and is not particularly limited as long as the liquid electrolyte can be generally used in batteries, photoelectric conversion elements, and the like. Specifically, examples thereof include a liquid electrolyte formed of a redox species and a solvent which can dissolve the redox species, a liquid electrolyte formed of a redox species and a molten salt which can dissolve the redox species, and a liquid electrolyte formed of a redox species as well as a solvent and a molten salt which can dissolve the redox species.

Examples of the redox species include redox species based on $I^-/I^{3-}$, $Br^{2-}/Br^{3-}$, $Fe^{2+}/Fe^{3+}$, quinone/hydroquinone, and the like. Particularly, it is preferable that the liquid electrolyte contains at least one of an iodide ion or a triiodide ion as the redox species.

Specifically, a combination of a metal iodide and iodine ($I_2$) such as lithium iodide (LiI), sodium iodide (NaI), potassium iodide (KI), or calcium iodide ($CaI_2$), a combination of a tetraalkylammonium salt and iodine such as tetraethylammonium iodide (TEAI), tetrapropylammoniuim iodide (TPAI), tetrabutylammonium iodide (TBAI), or tetrahexylammonium iodide (THAI), and a combination of a metal bromide and bromine such as lithium bromide (LiBr), sodium bromide (NaBr), potassium bromide (KBr), or calcium bromide ($CaBr_2$) are preferable. Among these, a combination of LiI and $I_2$ is particularly preferable.

Examples of the solvent of the redox species include a carbonate compound such as propylene carbonate, a nitrile compound such as acetonitrile, alcohols such as ethanol, water, an aprotic polar substance, and the like. Among these, a carbonate compound or a nitrile compound is particularly preferable. Two or more kinds of these solvents can be used by being mixed together.

The solid electrolyte is a conductive material which can transport electrons, holes, and ions, and may be a substance which can be used as an electrolyte for a photoelectric conversion element and does not have fluidity. Specifically, examples thereof include a hole transport material such as polycarbazole, an electron transport material such as tetranitrofluorenone, a conductive polymer such as polypyrrole, a polymer electrolyte obtained by solidifying a liquid electrolyte by using a polymer compound, a p-type semiconductor such as copper iodide or copper thiocyanate, an electrolyte obtained by solidifying a molten salt-containing liquid electrolyte by using fine particles, and the like.

The gel electrolyte is generally formed of an electrolyte and a gelatinization agent. Examples of the gelatinization agent include a polymer gelatinization agent such as a cross-linked polyacrylic resin derivative, a cross-linked polyacrylonitrile derivative, a polyalkylene oxide derivative, silicone resins, or a polymer having a nitrogen-containing heterocyclic quaternary compound salt structure on a side chain, and the like.

The molten salt gel electrolyte is generally formed of the aforementioned gel electrolyte and a room temperature-type molten salt. Examples of the room temperature-type molten salt include a nitrogen-containing heterocyclic quaternary ammonium salt compounds such as pyridinium salts and imidazolium salts, and the like.

If necessary, additives may be added to the aforementioned electrolyte. Examples of the additives include a nitrogen-containing aromatic compound such as t-butylpyridine (TBP) and imidazole salts such as dimethylpropylimidazole iodide (DMPII), methylpropylimidazole iodide (MPII), ethylmethylimidazole iodide (EMIT), ethylimidazole iodide (EII), and hexylmethylimidazole iodide (HMII).

The electrolyte concentration in the electrolyte is preferably within a range of 0.001 to 1.5 mol/L, and particularly preferably within a range of 0.01 to 0.7 mol/L. Here, in a case where the catalyst layer 6a is on the light receiving surface side within the photoelectric conversion element of the present invention, through the electrolyte, the incidence rays reach the porous semiconductor layer to which a dye is adsorbed, and hence carriers are excited. Accordingly, the performance deteriorates in some cases due to the concentration of the electrolyte used in the photoelectric conversion element in which the catalyst layer 6a is on the light receiving surface side. Therefore, it is preferable to set the electrolyte concentration in consideration of such cases.

<Cover Layer>

In FIG. 1, the cover layer 7 is provided in the photoelectric conversion element 10. The cover layer 7 is preferred for preventing the volatilization of the electrolyte and preventing water or the like from permeating the photoelectric conversion element 10.

The material constituting the cover layer 7 is not particularly limited as long as the material can be generally used in photoelectric conversion elements and can exhibit the effects of the present invention. Examples of such a material include soda lime glass, lead glass, borosilicate glass, molten quartz glass, crystalline quartz glass, and the like. As the material, soda lime float glass is particularly preferable.

<Sealing Material>

In FIG. 1, the sealing material 8 is provided in the photoelectric conversion element 10. The sealing material 8 is preferred for preventing the volatilization of the electrolyte and preventing water or the like from permeating the photoelectric conversion element 10.

Furthermore, the sealing material 8 is preferred for (1) absorbing a falling object or stress (impact) acting on the supporting substrate 1 and for (2) absorbing flexure or the like acting on the supporting substrate 1 during long-term use.

The material constituting the sealing material 8 is not particularly limited as long as the material can be generally used in photoelectric conversion elements and can exhibit the effects of the present invention. As such a material, for example, a silicone resin, an epoxy resin, a polyisobutylene-based resin, a hot melt resin, glass frit, and the like are preferable. Two or more kinds of these materials can be used in the form of two or more layers. In a case where a nitrile-based solvent or a carbonate-based solvent is used as a solvent for a redox electrolyte, a silicone resin, a hot melt resin (for example, an ionomer resin), a polyisobutylene-based resin, and glass frit are particularly preferable.

<<Method for Manufacturing Photoelectric Conversion Element>>

The method for manufacturing the photoelectric conversion element of the present invention is not particularly limited. The method for manufacturing the photoelectric conversion element 10 shown in FIG. 1 includes, for example, a step of forming a laminate in which the conductive layer 2, the power generating layer 4 having a porous semiconductor layer onto which a metal complex dye represented by Formula (1) is adsorbed, the porous insulating layer 5, and the counter electrode conductive layer 6 are laminated in this order on one surface of the supporting substrate 1, a step of forming the cover layer 7 and the sealing material 8 on the outer periphery of the laminate, and a step of injecting an electrolyte into the electrolyte filling region 9 surrounded by the conductive layer 2, the cover layer 7, and the sealing material 8.

<Formation of Conductive Layer>

The method for forming the conductive layer 2 on the supporting substrate 1 is not particularly limited, and examples thereof include a known sputtering method, spray method, or the like.

In a case where a metal lead wire is provided on the conductive layer 2, for example, it is possible to use a method of forming a metal lead wire on the supporting substrate 1 by a known sputtering method, vapor deposition method, or the like and then forming the conductive layer 2 on the obtained supporting substrate 1 including the metal lead wire, a method of forming the conductive layer 2 on the supporting substrate 1 and then forming a metal lead wire on the conductive layer 2, and the like.

The scribe line 3 can be formed by cutting the conductive layer 2 by means of laser scribing.

<Formation of Power Generating Layer>

The method for forming a film-like porous semiconductor layer on the conductive layer 2 is not particularly limited, and examples thereof include known methods. Specific examples thereof include (1) method of coating the conductive layer 2 with a paste containing semiconductor particles by a screen printing method, an ink jet method, or the like and then performing calcination, (2) method of forming a film on the conductive layer 2 by using a chemical vapor deposition (CVD) method, a metalorganic chemical vapor deposition (MOCVD) method, or the like using a desired raw material gas (3) method of forming a film on the conductive layer by a physical vapor deposition (PVD) method, a vapor deposition method, a sputtering method, or the like using a raw material solid, (4) method of forming a film on the conductive layer by a sol-gel method or a method using an electrochemical redox reaction, and the like. Among these, a screen printing method using a paste is particularly preferable because this method makes it possible to form a porous semiconductor layer having a large film thickness at low costs.

Specifically, the method for forming a porous semiconductor layer by using titanium oxide as semiconductor particles is as described below, but the present invention is not limited thereto.

First, 125 mL of titanium isopropoxide (manufactured by Kishida Chemical Co., Ltd.) is added dropwise to 750 mL of 0.1 M aqueous nitric acid solution (manufactured by Kishida Chemical Co., Ltd.) such that hydrolysis occurs, and heating the solution for 8 hours at 80° C., thereby preparing a sol liquid. Then, the obtained sol liquid is heated for 11 hours at 230° C. in an autoclave made of titanium such that titanium oxide particles grow, followed by an ultrasonic dispersion for 30 minutes, thereby preparing a colloidal solution containing titanium oxide particles having an average particle size (average primary particle size) of 15 nm. Thereafter, ethanol having a volume twice the volume of the obtained colloidal solution was added to the colloidal solution, and the solution was subjected to centrifugation at a rotation speed of 5,000 rpm, thereby obtaining titanium oxide particles.

In the present specification, the average particle size is a value determined from a diffraction peak of X-ray diffraction (XRD). Specifically, from the half-width of a diffraction angle in θ/2θ XRD scanning and the Scherrer equation, the average particle size is determined. For example, for anatase-type titanium oxide, the half-width of a diffraction angle (2θ=about) 25.3° corresponding to (101) plane may be measured.

Then, the obtained titanium oxide particles are washed, a solution obtained by dissolving ethyl cellulose and terpineol in anhydrous ethanol was then added thereto, and the titanium oxide particles are dispersed by stirring. Subsequently, the mixed solution is heated under a vacuum condition such that ethanol is evaporated, thereby obtaining a titanium oxide paste. The concentration is adjusted such that the finally obtained past is composed of 20% by mass (solid concentration) of titanium oxide, 10% by mass of ethyl cellulose, and 64% by mass of terpineol.

Examples of the solvent used for preparing the paste which contains semiconductor particles (or in which the semiconductor particles are suspended) include, in addition to the aforementioned solvents, a glyme-based solvent such as ethylene glycol monomethyl ether, an alcohol-based solvent such as isopropyl alcohol, a mixed solvent such as isopropyl alcohol/toluene, water, and the like.

Thereafter, the conductive layer 2 is coated with the paste containing semiconductor particles by the aforementioned method, followed by calcination, thereby obtaining a porous semiconductor layer. The conditions of drying and calcination, such as temperature, time, and atmosphere, need to be appropriately adjusted according to the type of the supporting substrate 1 or the semiconductor particles used. For example, calcination can be performed for about 10 seconds to 12 hours in the atmosphere or in an inert gas atmosphere at a temperature within a range of about 50° C. to 800° C.

Examples of the method for causing a dye to be adsorbed onto the porous semiconductor layer include a method of immersing the porous semiconductor layer formed on the conductive layer 2 in a solution in which a dye is dissolved (solution for dye adsorption).

The solvent for dissolving a dye may be a solvent dissolving a dye, and specific examples thereof include alcohols such as ethanol, ketones such as acetone, ethers such as diethyl ether and tetrahydrofuran, nitrogen compounds such as acetonitrile, halogenated aliphatic hydrocarbons such as chloroform, aliphatic hydrocarbons such as hexane, aromatic hydrocarbons such as benzene, esters such as ethyl acetate, water, and the like.

In a case where the laminate has a large film thickness as in a case where the power generating layer 4 (negative electrode), the porous insulating layer 5, and the counter electrode conductive layer 6 (positive electrode) are laminated on a single sheet of supporting substrate 1, or in a case where the molecular weight of a dye is large, it is better to use two or more kinds of solvents dissolving the dye by mixing the solvents together, and it is preferable to control the dye adsorption speed (state) by using one or more kinds of solvents that poorly dissolves the dye and one or more kinds of solvents that can dissolve the dye. It is more preferable to use a mixed solvent of one or more kinds of nitrile compounds and one or more kinds of alcohols.

The dye concentration in the solution can be appropriately adjusted by the type of the dye and solvent used. In order to improve the absorptivity, it is preferable that the dye concentration is high. For example, the dye concentration may be equal to or higher than $5 \times 10^{-4}$ mol/L.

<Formation of Porous Insulating Layer>

The method for forming the film-like porous insulating layer 5 on the power generating layer 4 is not particularly limited, and examples thereof include known methods. Specifically, examples of the methods include (1) method of coating at least the power generating layer 4 with a paste containing an insulating material by a screen printing method, an ink jet method, or the like and then performing calcination, (2) method of forming a film on at least the power generating layer 4 by using a CVD method, a MOCVD method, or the like using a desired raw material gas, (3) method of forming a film on at least the power generating layer 4 by a PVD method, a vapor deposition method, a sputtering method, or the like using a raw material solid, (4) method of forming a film on at least the power generating layer 4 by a sol-gel method or a method using an electrochemical redox reaction, and the like. Among these, a screen printing method using a paste is particularly preferable because this method makes it possible to form the porous insulating layer 5 having a large film thickness at low costs.

<Formation of Counter Electrode Conductive Layer>

Examples of the method for forming the counter electrode conductive layer 6 on the porous insulating layer 5 include a vapor deposition method, a printing method, and the like. In a case where the counter electrode conductive layer 6 is formed by a vapor deposition method, because the film itself is porous, it is not necessary to additionally form holes through which the solution for dye adsorption or the electrolyte moves.

In a case where holes are formed in the counter electrode conductive layer 6, for example, it is possible to use a method of causing the counter electrode conductive layer 6 to partially evaporate by being irradiated with laser beams.

As the method for forming the catalyst layer 6a on any one of the surfaces of the counter electrode conductive layer 6, it is possible to use known formation methods such as a screen printing method, a vapor deposition method, and a CVD method.

<Formation of Sealing Material>

The sealing material 8 is prepared by cutting out a thermal fusion film, an ultraviolet curable resin, or the like, in the shape that surrounds the periphery of the laminate.

In a case where a silicone resin, an epoxy resin, or a glass frit is used, the pattern of the sealing material 8 can be formed by using a dispenser. In a case where a hot melt resin is used, the pattern of the sealing material 8 can be formed by boring holes formed by performing patterning in a sheet-like hot melt resin.

The sealing material 8 is disposed between the conductive layer 2 and the cover layer 7 as if bonding the conductive layer 2 and the cover layer 7 to each other, and is fixed by heating or ultraviolet irradiation.

<Electrolyte Filling>

By being injected through holes for electrolyte injection that are provided in advance in the cover layer 7, the electrolyte (carrier transport material) fills the electrolyte filling region 9. After the injection of the electrolyte, the holes for electrolyte injection are sealed using an ultraviolet curable resin.

<<Dye Sensitized Solar Cell>>

The dye sensitized solar cell of the present invention is not particularly limited as long as it includes a plurality of photoelectric conversion elements of the present invention that are connected to each other. The dye sensitized solar cell is referred to as a photoelectric conversion module in some cases. The number of photoelectric conversion elements connected to each other and the connection method are not particularly limited and appropriately determined. As the connection method, a method (serial connection) is preferable in which in two photoelectric conversion elements adjacent to each other with the scribe line 3 in between the elements, the counter electrode conductive layer (second conductive layer 6b) of one photoelectric conversion element (not shown in FIG. 1) and the conductive layer 2 of the other photoelectric conversion element are electrically connected to each other as shown in FIG. 1. In this case, the dye sensitized solar cell of the present invention can be manufactured by providing the counter electrode conductive layer such that the counter electrode conductive layer is connected to the conductive layer of the adjacent photoelectric conversion element.

<Metal Complex Dye>

Hereinafter, the dye used in the present invention will be described.

The dye used in the present invention is a metal complex dye represented by Formula (1).

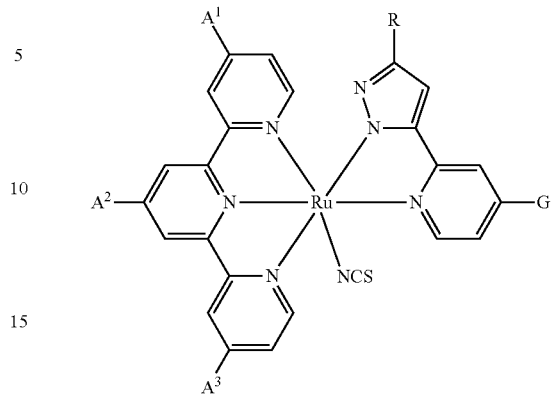

Formula (1)

In Formula (1), R represents a hydrogen atom, an alkyl group, or an aryl group. Among these, an alkyl group is preferable.

The number of carbon atoms in the alkyl group represented by R is preferably 1 to 20, and more preferably 1 to 10. Examples of the alkyl group include methyl, ethyl, propyl, n-butyl, t-butyl, pentyl, hexyl, pentyl, and the like. The alkyl group may further have a substituent. As the substituent, a halogen atom is preferable. Examples of the halogen atom include a fluorine atom, a chlorine atom, and a bromine atom. Among these, a fluorine atom is preferable. In the alkyl group substituted with a halogen atom, the number of halogen atoms substituting the alkyl group may be 1 or 2 or greater. However, an alkyl group in which all the hydrogen atoms are substituted with halogen atoms is preferable, and particularly, a perfluoroalkyl group is preferable. Examples of the alkyl group substituted with a halogen atom include fluoromethyl, difluoromethyl, trifluoromethyl, 2,2,2-trifluoroethyl, and the like.

The alkyl group represented by R is preferably an alkyl group substituted with a halogen atom, more preferably an alkyl group substituted with a fluorine atom, and particularly preferably trifluoromethyl.

The number of carbon atoms in the aryl group represented by R is preferably 6 to 20, and more preferably 6 to 12. Examples of the aryl group include phenyl, naphthyl, and the like. The aryl group may further have a substituent. As the substituent, a halogen atom is preferable. Examples of the halogen atom include a fluorine atom, a chlorine atom, and a bromine atom. Among these, a fluorine atom is preferable. In the aryl group substituted with a halogen atom, the number of halogen atoms substituting the aryl group may be 1 or 2 or greater. Examples of the aryl group substituted with a halogen atom include 4-fluorophenyl, 2,4-difluorophenyl, perfluorophenyl, and perchlorophenyl.

Among the above, as R, a hydrogen atom, methyl, trifluoromethyl, and perfluorophenyl are preferable, and trifluoromethyl is particularly preferable.

G represents a group represented by any one of Formulae (G-1) to (G-4). Among the groups represented by Formulae (G-1) to (G-4), a group represented by Formula (G-1) is preferable.

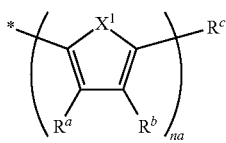

Formula (G-1)

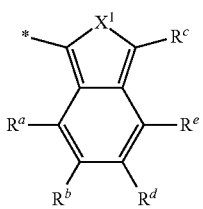

Formula (G-2)

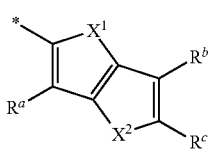

Formula (G-3)

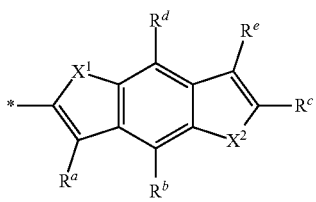

Formula (G-4)

In Formulae (G-1) to (G-4), $X^1$ and $X^2$ each independently represent —O—, —S—, —Se—, —N($R^A$)—, —C($R^A$)$_2$—, or —Si($R^A$)$_2$—. $R^A$ represents a hydrogen atom, an alkyl group, or an aryl group.

The portion of * represents a position bonded to a pyridine ring.

In Formulae (G-1) and (G-2), each $X^1$ is preferably a group selected from —O—, —S—, —Se—, and —N($R^A$)—, more preferably a group selected from —O— and —S—, and even more preferably —S—. In Formulae (G-3) and (G-4), each of $X^1$ and $X^2$ is preferably a group selected from —O—, —S—, —Se—, and —N($R^A$)—. A case where any one of $X^1$ and $X^2$ is —S— is more preferable, and a case where both of $X^1$ and $X^2$ are —S— is particularly preferable.

The number of carbon atoms in the alkyl group represented by $R^A$ is preferably 1 to 20, and more preferably 1 to 12. Examples of the alkyl group include methyl, ethyl, propyl, n-butyl, t-butyl, heptyl, hexyl, 2-ethylhexyl, pentyl, octyl, nonyl, decyl, dodecyl, and the like. The alkyl group may further have a substituent. As the substituent, a halogen atom is preferable. Examples of the halogen atom include a fluorine atom, a chlorine atom, and a bromine atom. Among these, a fluorine atom is preferable. In the alkyl group substituted with a halogen atom, the number of halogen atoms substituting the alkyl group may be 1 or 2 or greater. Examples of the alkyl group substituted with a halogen atom include trifluoromethyl, 2,2,2-trifluoroethyl, 3,3,3-trifluoropropyl, and the like.

The aryl group represented by $R^A$ has the same definition as the aryl group represented by R, and a preferred range thereof is also the same.

Among the above, as $R^A$, a hydrogen atom, methyl, hexyl, and phenyl are preferable.

na represents an integer of 1 to 3. na is preferably 1 or 2, and particularly preferably 1.

$R^a$ represents an alkyl group, an alkoxy group, an alkylthio group, or an amino group. $R^b$, $R^c$, $R^d$, and $R^e$ each independently represent a hydrogen atom or a substituent.

The number of carbon atoms in the alkyl group represented by $R^a$ is preferably 1 to 20, more preferably 2 to 14, even more preferably 2 to 12, still more preferably 4 to 12, and particularly preferably 6 to 8. Examples of the alkyl group include methyl, ethyl, propyl, n-butyl, t-butyl, pentyl, hexyl, 2-ethylhexyl, heptyl, octyl, nonyl, decyl, dodecyl, and tetradecyl.

Among these, n-butyl, t-butyl, pentyl, hexyl, 2-ethylhexyl, heptyl, octyl, nonyl, decyl, and dodecyl are preferable, pentyl, hexyl, 2-ethylhexyl, and octyl are more preferable, and hexyl is particularly preferable.

The number of carbon atoms in the alkoxy group represented by $R^a$ is preferably 1 to 20, more preferably 1 to 12, even more preferably 4 to 12, and particularly preferably 6 to 8. Examples of the alkoxy group include methoxy, ethoxy, propoxy, n-butoxy, t-butoxy, pentoxy, hexyloxy, 2-ethylhexyloxy, heptyloxy, octyloxy, nonyloxy, decyloxy, and dodecyloxy.

Among these, n-butoxy, t-butoxy, hexyloxy, 2-ethylhexyloxy, heptyloxy, octyloxy, nonyloxy, decyloxy, and dodexyloxy are preferable, and hexyloxy, 2-ethylhexyloxy, and octyloxy are more preferable.

The number of carbon atoms in the alkylthio group represented by $R^a$ is preferably 1 to 20, more preferably 1 to 12, even more preferably 4 to 12, and particularly preferably 6 to 8. Examples of the alkylthio group include methylthio, ethylthio, propylthio, n-butylthio, t-butylthio, pentylthio, hexylthio, 2-ethylhexylthio, heptylthio, octylthio, nonylthio, decylthio, dodecylthio, and octadecylthio.

Among these, n-butylthio, t-butylthio, hexylthio, 2-ethylhexylthio, heptylthio, octylthio, nonylthio, and decylthio are preferable, and hexylthio, 2-ethylhexylthio, and octylthio are more preferable.

The amino group represented by $R^a$ includes amino (—NH$_2$), an alkylamino group, and an arylamino group. The number of carbon atoms in the amino group is preferably 0 to 40, more preferably 2 to 20, and even more preferably 8 to 18.

Among the amino groups, amino (—NH$_2$) and an alkylamino group are preferable. The alkylamino group is preferably a dialkylamino group, and examples thereof include dimethylamino, diethylamino, dipropylamino, dibutylamino, dihexylamino, diheptylamino, dioctylamino, dinonylamino, didecylamino, didodecylamino, and dioctadecylamino.

Among these, dimethylamino, diethylamino, dipropylamino, dibutylamino, dihexylamino, diheptylamino, and dioctylamino are preferable, and dibutylamino and dihexylamino are more preferable.

Among the above, as $R^a$, an alkyl group is preferable. The alkyl group is preferably an alkyl group having 1 to 20 carbon atoms, more preferably an alkyl group having 2 to 14 carbon atoms, even more preferably alkyl group having 2 to 12 carbon atoms, still more preferably an alkyl group having 4 to 12 carbon atoms, and particularly preferably an alkyl group having 6 to 8 carbon atoms. Among these, as the alkyl group, a linear alkyl group is preferable.

Examples of substituent represented by $R^b$, $R^c$, $R^d$, and $R^e$ include a halogen atom, an alkyl group, an alkenyl group, an alkynyl group, an aryl group, a heterocyclic group, an alkoxy group, an alkylthio group, and an amino group.

$R^b$, $R^c$, $R^d$, and $R^e$ are preferably a hydrogen atom and the aforementioned substituents, and particularly preferably a hydrogen atom.

$A^1$, $A^2$, and $A^3$ each independently represent a hydrogen atom, a carboxyl group, or a salt of a carboxyl group. Here, at least one of $A^1$, $A^2$, or $A^3$ is a carboxyl group or a salt of a carboxyl group.

In a case where $A^1$, $A^2$, or $A^3$ is a salt of a carboxyl group, examples of the salt include a sodium salt, a potassium salt, an ammonium salt, and a pyridinium salt of a carboxyl group. Among these, an ammonium salt of a carboxyl group is preferable.

In an ammonium cation of an ammonium salt, a group substituted with a nitrogen atom is preferably an alkyl group, an aralkyl group, or an aryl group. A case where all the groups are an alkyl group is more preferable. Examples of the ammonium cation include tetrabutyl ammonium, triethylbenzyl ammonium, tetraethyl ammonium, tetrapropyl ammonium, tetrahexyl ammonium, and tetraoctyl ammonium. Among these, tetrabutyl ammonium is preferable.

A case where all the $A^1$, $A^2$, and $A^3$ represent a carboxyl group or a salt of a carboxyl group is preferable. In this case, a carboxyl group or an ammonium salt of a carboxyl group is particularly preferable.

The metal complex dye represented by Formula (1) is preferably a metal complex dye represented by Formula (2).

Formula (2)

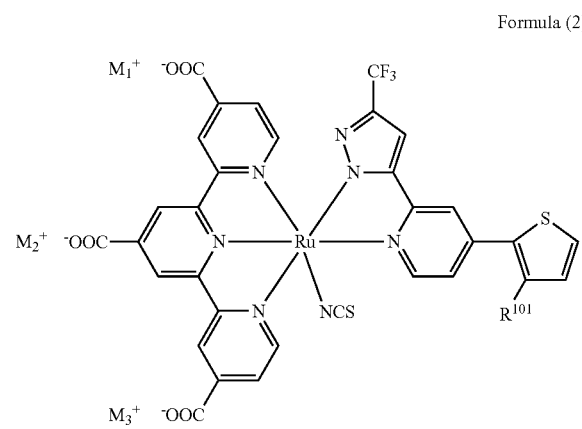

In Formula (2), $M_1^+$, $M_2^+$, and $M_3^+$ each independently represent a proton ($H^+$) or a counterion. Among these, a proton or an ammonium ion is preferable. Particularly, a case is preferable in which at least one of $M_1^+$, $M_2^+$, or $M_3^+$ is a proton.

Examples of ammonium ions include the ammonium cations exemplified above for the aforementioned ammonium salt of a carboxyl group. Among these, tetrabutyl ammonium, triethylbenzyl ammonium, tetraethyl ammonium, tetrapropyl ammonium, tetrahexyl ammonium, and tetraoctyl ammonium are preferable, and tetrabutyl ammonium is particularly preferable.

$R^{101}$ represents an alkyl group. This alkyl group has the same definition as the alkyl group represented by $R^a$, and a preferred range thereof is also the same.

Specific preferred examples of the metal complex dye represented by Formula (1) will be shown below, but the present invention is not limited thereto.

In the following specific examples, in a case where any one of $M_1^+$, $M_2^+$, and $M_3^+$ is a counterion, for the sake of convenience, $M_1^+$ is described as a counterion. However, there is also a case where $M_1^+$ is a proton while $M_2^+$ or $M_3^+$ is a counterion.

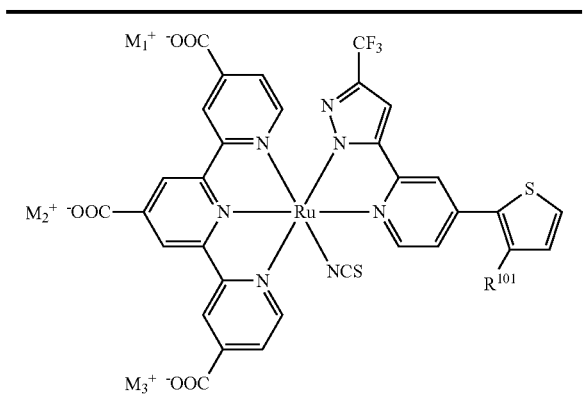

| Dye No. | $R^{101}$ | $M_1^+$ | $M_2^+$ | $M_3^+$ |
|---|---|---|---|---|
| Dye 1 | n-$C_8H_{17}$ | $H^+$ | $H^+$ | $H^+$ |
| Dye 2 | n-$C_8H_{17}$ | (n-$C_4H_9)_4N^+$ | $H^+$ | $H^+$ |
| Dye 3 | n-$C_6H_{13}$ | $H^+$ | $H^+$ | $H^+$ |
| Dye 4 | n-$C_6H_{13}$ | (n-$C_4H_9)_4N^+$ | $H^+$ | $H^+$ |
| Dye 5 | n-$C_{10}H_{21}$ | $H^+$ | $H^+$ | $H^+$ |
| Dye 6 | n-$C_{10}H_{21}$ | (n-$C_4H_9)_4N^+$ | $H^+$ | $H^+$ |
| Dye 7 | n-$C_4H_9$ | $H^+$ | $H^+$ | $H^+$ |
| Dye 8 | n-$C_4H_9$ | (n-$C_4H_9)_4N^+$ | $H^+$ | $H^+$ |
| Dye 9 | n-$C_4H_9$ | Na+ | $H^+$ | $H^+$ |
| Dye 10 | n-$C_{12}H_{25}$ | $H^+$ | $H^+$ | $H^+$ |
| Dye 11 | n-$C_{14}H_{29}$ | $H^+$ | $H^+$ | $H^+$ |

The metal complex dye represented by Formula (1) can be synthesized based on the general method for synthesizing a Ru metal complex dye. The specific synthesis method of the metal complex dye represented by Formula (1) is described in examples by using metal complex dyes Dye 3 and Dye 4, for example. The above metal complex dyes of Dye Nos. 1, 2, 5 to 11, and the like can also be synthesized by the same synthesis method as used for synthesizing Dye 3 and Dye 4.

EXAMPLES

Hereinafter, the present invention will be more specifically described based on examples, but the present invention is not limited thereto.

(Synthesis of Metal Complex Dye)

Hereinafter, the synthesis method of the metal complex dye will be specifically described by using synthesis examples, but the starting material, the dye intermediate, and the synthesis route are not limited to the synthesis examples.

In the present specification, room temperature means 25° C.

1. Synthesis of Example Metal Complex Dye Dye 3

An example metal complex dye Dye 3 was synthesized according to a method of the following scheme.

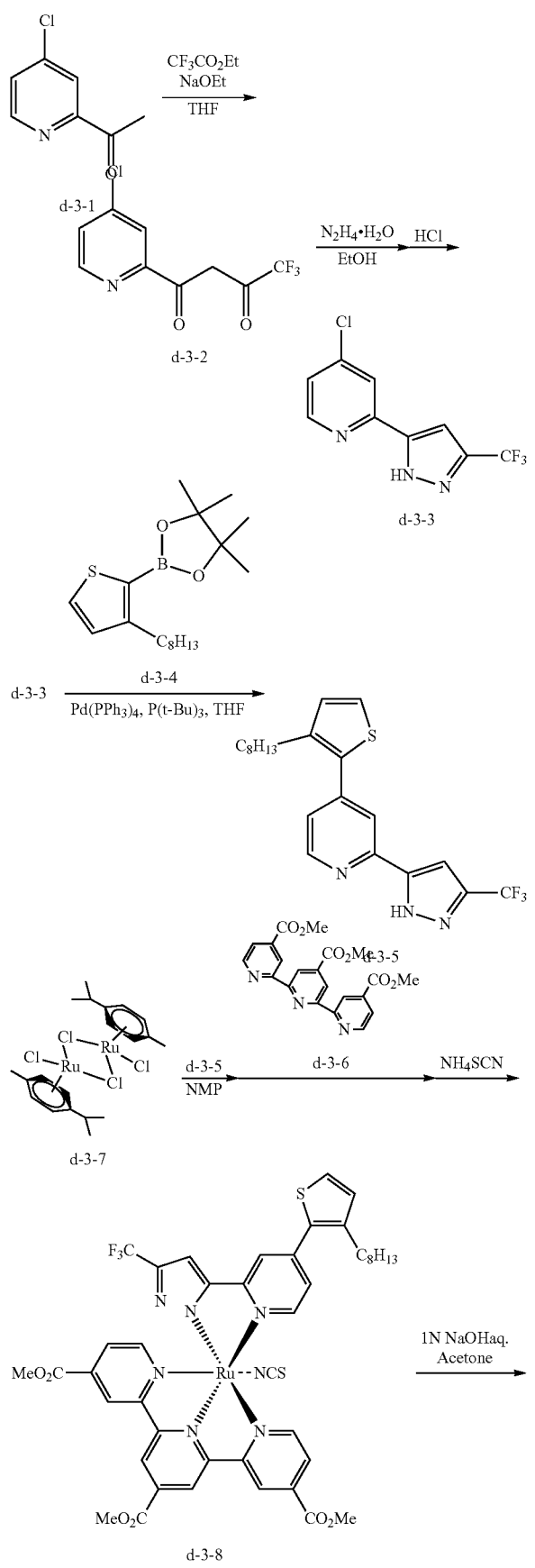

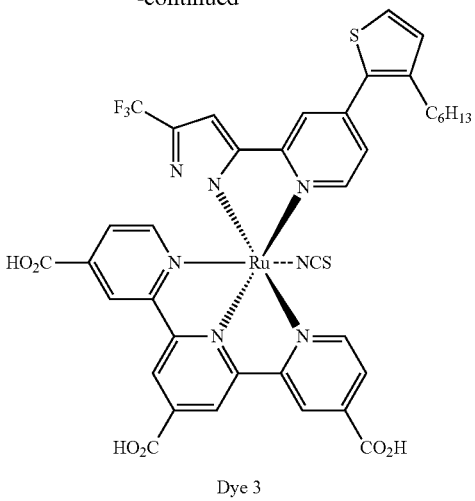

Dye 3

(i) Synthesis of Compound d-3-2

A compound d-3-1 (2-acetyl-4-chloropyridine) was dissolved in tetrahydrofuran (THF), and while the solution was being stirred at 0° C. in a nitrogen atmosphere, sodium ethoxide was added thereto, followed by stirring for 15 minutes. Then, ethyl trifluoroacetic acid was added dropwise thereto, and the solution was stirred for 20 minutes at an external temperature of 70° C. The reaction solution was cooled to room temperature, an aqueous ammonium chloride solution was then added dropwise thereto, liquid separation was performed, and then the organic layer was concentrated, thereby obtaining a compound d-3-2 as a crude purified product.

(ii) Synthesis of Compound d-3-3

The compound d-3-2 was dissolved in ethanol. While the solution was being stirred at room temperature in a nitrogen atmosphere, hydrazine monohydrate was added thereto, and the solution was heated for 12 hours at an external temperature of 90° C. Then, concentrated hydrochloric acid was added thereto, and the solution was stirred for 1 hour. The reaction solution was concentrated, extraction was then performed using aqueous sodium bicarbonate and ethyl acetate, liquid separation was carried out, and then the organic layer was concentrated. By performing recrystallization by using acetonitrile, a compound d-3-3 was obtained.

(iii) Synthesis of Compound d-3-5

The compound d-3-3, a compound d-3-4, tetrakis triphenylphosphine palladium, and t-butylphosphine were added to tetrahydrofuran in a nitrogen atmosphere, and the solution was heated under reflux with stirring. Then, an ammonium chloride solution was added thereto, extraction was performed using ethyl acetate, and liquid separation was carried out. The organic layer was concentrated and purified by silica gel column chromatography, and then a compound d-3-5 was obtained.

(iv) Synthesis of Example Metal Complex Dye 3

A compound d-3-7 and the compound d-3-5 were added to 150 ml of N-methylpyrrolidone (NMP), and the solution was stirred for 3 hours at 70° C. in a nitrogen atmosphere. Then, a compound d-3-6 was added thereto, and the solution was heated and stirred for 8 hours at 160° C. Subsequently, ammonium thiocyanate was added thereto, followed by stirring for 8 hours at 160° C. The reaction solution was concentrated, water was then added thereto, and filtration was performed. The filtrate was purified by silica gel column chromatography, then added to a mixed solvent of 30 ml of acetone and 40 ml of a 1 N aqueous sodium hydroxide solution, and stirred for 24 hours at an external temperature of 65° C. The solution was cooled to room temperature, the pH thereof was adjusted to become 3 by using hydrochloric acid, and the precipitate was filtered, thereby obtaining a crude purified product.

The crude purified product was dissolved in a methanol solution together with tetrabutylammonium hydroxide (TBAOH) and purified using a Sephadex LH-20 column. The fraction of the main layer was recovered and concentrated, a 0.1 M trifluoromethanesulfonic acid solution was then added thereto, the pH thereof was adjusted to became 3, and the precipitate was filtered, thereby obtaining an example metal complex dye Dye 3.

The structure of the obtained example metal complex dye Dye 3 was confirmed by mass spectrometry (MS).

MS-ESI m/z=902.07 (M-H)$^+$

The obtained example metal complex dye Dye 3 was measured by spectral absorption by using a dye solution in which the dye concentration was adjusted to become 17 μmol/L by using a tetrabutylammonium hydroxide methanol solution. As a result, the wavelength of maximum absorbance on the longest wavelength side was 690 nm.

2. Synthesis of Example Metal Complex Dye Dye 4

The example metal complex dye Dye 3 was dissolved in 1 equivalent of tetrabutylammonium hydroxide methanol, the methanol as a solvent was concentrated to dryness and then dried under reduced pressure, thereby synthesizing an example metal complex dye Dye 4.

The structure of the obtained example metal complex dye Dye 4 was confirmed by MS.

MS-ESI m/z=902.07 (M-H)$^+$

The obtained example metal complex dye Dye 4 was measured by spectral absorption by using a dye solution in which the dye concentration was adjusted to become 17 μmol/L by using a tetrabutylammonium hydroxide methanol solution. As a result, the wavelength of maximum absorbance on the longest wavelength side was 690 nm.

3. Synthesis of Example Metal Complex Dyes Dye 2, 6, and 8 to 11

Example metal complex dyes Dye 2, 6, and 8 to 11 were synthesized by the same method as the synthesis method of the example metal complex dyes Dye 3 and Dye 4.

Examples 1 to 8

The dye sensitized solar cell 20 shown in FIG. 1 was prepared by the following method.

A 70 mm×70 mm×4 mm (thickness) glass substrate (manufactured by Nippon Sheet Glass Co., Ltd., glass with SnO$_2$ film) was prepared in which the conductive layer 2 formed of a fluorine-doped SnO$_2$ film was formed on the supporting substrate 1 formed of glass.

(i) Cutting Conductive Layer 2 (Transparent Conductive Layer)

The conductive layer 2 was irradiated with laser beams (YAG laser, fundamental wavelength: 1.06 μm, manufactured by SEISHIN TRADING CO., LTD) such that SnO$_2$ evaporated. In this way, a scribing process was performed to form seven linear scribes.

(ii) Preparation of Porous Semiconductor Layer

A commercially available titanium oxide paste (manufactured by Solaronix SA, tradename: Ti-Nanoxide D/SP, average particle size: 13 nm) was printed on the conductive layer 2 on the glass substrate by using a screen printing machine LS-34TVA (manufactured by NEWLONG SEIMITSU KOGYO CO., LTD) such that the scribe lines were interposed between 7 rectangles. Then, the resultant was preliminarily dried for 30 minutes at 300° C. and then calcined for 40 minutes at 500° C., and these steps were performed twice. As a result, as a porous semiconductor layer, a titanium oxide film having a film thickness of 12 μm was obtained.

(iii) Preparation of Porous Insulating Layer

Fine particles of zirconium oxide (particle size: 100 nm, manufactured by C. I. Kasei CO., LTD) were dispersed in terpineol and mixed with ethyl cellulose, thereby preparing a paste.

The zirconium oxide paste was printed on the aforementioned titanium oxide layer by using a printing machine LS-34TVA (manufactured by NEWLONG SEIMITSU KOGYO CO., LTD). The resultant was preliminarily dried for 30 minutes at 300° C. and then calcined for 40 minutes at 500° C. In this way, as a porous insulating layer, a zirconium oxide film having a film thickness of 6 μm was obtained.

(iv) Preparation of Counter Electrode Conductive Layer 6

By using a vapor deposition machine (model name: ei-5, manufactured by ULVAC, Inc.), a film formed of platinum (catalyst layer 6a) was formed at 0.01 nm/s on the aforementioned titanium oxide film/zirconium oxide film. The film thickness was 100 nm. Then, by using the vapor deposition machine (model name: ei-5, manufactured by ULVAC, Inc.), a film formed of titanium (second conductive layer 6b) was formed at 0.5 nm/s on the aforementioned film formed of platinum. The film thickness was 1,000 nm.

(v) Adsorption of Metal Complex Dye Represented by Formula (1)

Thereafter, as Examples 1 to 8, in a solution for dye adsorption obtained using the example metal complex dye Dye 2, Dye 3, Dye 4, Dye 6, Dye 8, Dye 9, Dye 10, or Dye 11, the laminate prepared as above was immersed for 60 hours at room temperature. Then, the laminate was washed with ethanol and then dried for about 5 minutes at a temperature of about 60° C. In this way, the metal complex dye was adsorbed onto the porous semiconductor layer.

Herein, the solution for dye adsorption was prepared by dissolving the dye in acetonitrile:t-butanol=1:1 such that the dye concentration became $4\times10^{-4}$ mol/L.

(vi) Preparation of Electrolyte

Iodine (manufactured by Sigma-Aldrich Co. LLC.) was added to 3-methoxypropiontrile (manufactured by Sigma-Aldrich Co. LLC.) such that the concentration became 0.15 mol/L, and dimethylpropylimidazole iodide (DMPII, manufactured by SHIKOKU CHEMICALS CORPORATION) was added thereto such that the concentration became 0.8 mol/L. Furthermore, guanidine thiocyanate (manufactured by Sigma-Aldrich Co. LLC.) was added thereto such that the concentration became 0.1 mol/L, and then N-methylbenzimidazol (manufactured by Sigma-Aldrich Co. LLC.) was added thereto such that the concentration became 0.5 mol/L. The solution was stirred for 30 minutes by using a stirrer, thereby preparing an electrolyte.

(vii) Preparation of Dye Sensitized Solar Cell

Separately prepared cover glass was superposed on the aforementioned laminate having the porous semiconductor layer onto which each dye was adsorbed. Thereafter, the lateral surface of the cover glass and the laminate was sealed with a resin 3035B (manufactured by ThreeBond Holdings Co., Ltd.). Then, the electrolyte was injected thereinto through the holes formed in the cover glass, and a lead wire was mounted on each electrode, thereby obtaining a dye sensitized solar cell 20 (solar cell obtained by connecting 7 photoelectric conversion elements 10 in series) shown in FIG. 1.

Comparative Examples 1 and 2

Dye sensitized solar cells were prepared in the same manner as in Example 1, except that S-1 dye shown below was used in Comparative Example 1 while S-2 dye shown below was used in Comparative Example 2.

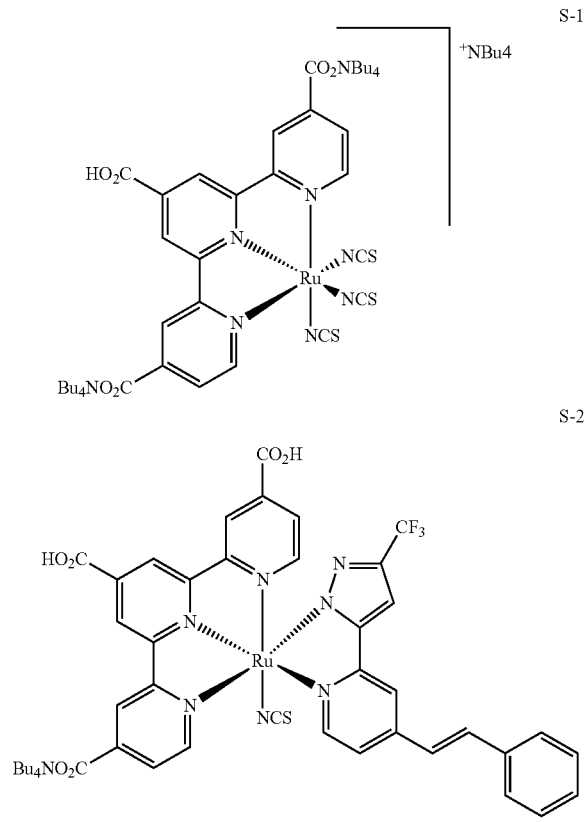

Each of the dye sensitized solar cells of Examples 1 to 8 and Comparative Examples 1 and 2 prepared as above was evaluated by the following testing method. The obtained results are summarized in Table 1.

(Testing Method)

By performing testing of battery characteristics, a photoelectric conversion efficiency η of the dye sensitized solar cell was measured. The testing of battery characteristics was performed using a solar simulator (manufactured by WACOM ELECTRIC CO., LTD., WXS-85H) by irradiating the solar cell with simulated solar rays at 1,000 W/m² from a xenon lamp that passed through an AM 1.5 filter. By using an I-V tester, the current-voltage characteristics were measured, and the photoelectric conversion efficiency (η/%) was determined.

As testing of durability (referred to as "high-temperature resistance" as well) at a high temperature, the photoelectric conversion module was held for 200 hours in a constant-temperature tank with a temperature of 85° C., the temporal change in the photoelectric conversion efficiency of the dye sensitized solar cell was measured, and a decay rate of the photoelectric conversion efficiency was determined.

The decay rate of the photoelectric conversion efficiency was calculated according to the following equation. The lower the decay rate of the photoelectric conversion efficiency is, the further the heat-induced decrease in the photoelectric conversion efficiency is inhibited (the better the durability is).

In the following equation, a photoelectric conversion efficiency measured after the dye sensitized solar cell was held for 200 hours in the constant-temperature tank with a temperature of 85° C. is represented by $\eta_{200\ hr}$, and a photoelectric conversion efficiency measured before the dye sensitized solar cell was held in the constant-temperature tank with a temperature of 85° C. is represented by $\eta$.

Decay rate of photoelectric conversion efficiency= $(\eta - \eta_{200\ hr}) \div \eta \times 100$ In Table 1, the photoelectric conversion efficiency is represented by "Effi.", and the decay rate of the photoelectric conversion efficiency is represented by "rate of performance deterioration".

Table 1 also shows the results of a short-circuit current density (Jsc), an open voltage (Voc), and a fill factor (FF) measured in the testing of battery characteristics.

TABLE 1

| | Metal complex dye No. | Jsc mA/cm² | Voc V | FF | Effi. % | Rate of performance deterioration % |
|---|---|---|---|---|---|---|
| Example 1 | Dye 2 | 2.60 | 5.04 | 0.70 | 9.17 | 6 |
| Example 2 | Dye 3 | 2.58 | 4.90 | 0.70 | 8.87 | 4 |
| Example 3 | Dye 4 | 2.65 | 4.97 | 0.71 | 9.36 | 5 |
| Example 4 | Dye 6 | 2.41 | 5.11 | 0.70 | 8 62 | 5 |
| Example 5 | Dye 8 | 2.67 | 4.90 | 0.71 | 9.27 | 6 |
| Example 6 | Dye 9 | 2.64 | 4.83 | 0.70 | 8.92 | 4 |
| Example 7 | Dye 10 | 2.54 | 4.90 | 0.70 | 8.73 | 4 |
| Example 8 | Dye 11 | 2.52 | 4.90 | 0.71 | 8.76 | 4 |
| Comparative Example 1 | S-1 | 2.26 | 4.83 | 0.67 | 7.32 | 47 |
| Comparative Example 2 | S-2 | 2.28 | 4.76 | 0.68 | 7.36 | 32 |

From the results shown in Table 1, it is understood that even though the present invention has a structure in which a porous insulating layer is used between a power generating layer and a counter electrode conductive layer, because the metal complex dye represented by Formula (1) is used, both the photoelectric conversion efficiency and the durability are improved.

Hitherto, the present invention and the embodiment thereof have been described. However, the inventors consider that, unless otherwise specified, the present invention is not limited to any of the details of the description of the present invention, and the present invention should be interpreted in a broad sense without departing from the gist and scope of the present invention shown in the attached claims.

The present application claims a priority based on JP2015-105248 filed on May 25, 2015 in Japan, the content of which is incorporated herein by reference as a portion of the description of the present specification.

EXPLANATION OF REFERENCES

1: supporting substrate
2: conductive layer (first conductive layer)
3: scribe line
4: power generating layer
5: porous insulating layer
6: counter electrode conductive layer
6a: catalyst layer
6b, 6c: second conductive layer
7: cover layer
8: sealing material
9: electrolyte filling region
10: photoelectric conversion element
20: dye sensitized solar cell

What is claimed is:

1. A photoelectric conversion element comprising:
a supporting substrate;
a conductive layer;
a power generating layer having a porous semiconductor layer onto which a metal complex dye is adsorbed;
a porous insulating layer; and
a counter electrode conductive layer,
wherein the layers are laminated in this order on the supporting substrate,
voids that each of the power generating layer, the porous insulating layer, and the counter electrode conductive layer has are filled with an electrolyte,
the metal complex dye is represented by Formula (2),

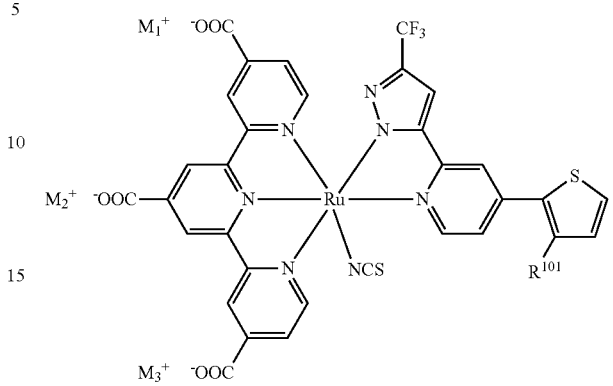

Formula (2)

wherein, in Formula (2), $M_1^+$, $M_2^+$, and $M_3^+$ each independently represents a proton or a counterion, and $R^{101}$ represents an alkyl group, and
an insulating material of the porous insulating layer is selected from the group consisting of glass, zirconium oxide, silicon oxide, aluminum oxide, niobium oxide, and strontium titanate.

2. The photoelectric conversion element according to claim 1,
wherein $R^{101}$ is an alkyl group having 2 to 12 carbon atoms.

3. A dye sensitized solar cell comprising:
a plurality of photoelectric conversion elements according to claim 1 that are connected to each other.

* * * * *